US006930377B1

(12) United States Patent
Bayan (10) Patent No.: US 6,930,377 B1
(45) Date of Patent: Aug. 16, 2005

(54) USING ADHESIVE MATERIALS AS INSULATION COATINGS FOR LEADLESS LEAD FRAME SEMICONDUCTOR PACKAGES

(75) Inventor: Jaime A. Bayan, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 139 days.

(21) Appl. No.: 10/310,534

(22) Filed: Dec. 4, 2002

(51) Int. Cl.$^7$ .................. H01L 23/495; H01L 23/48
(52) U.S. Cl. .............. 257/684; 257/796; 257/784; 257/786; 257/734; 257/737; 257/738; 257/691; 257/776; 257/775; 257/676; 257/675; 257/787
(58) Field of Search .................. 257/684, 666, 257/778, 737, 738, 734, 776, 775, 680, 774, 257/786, 784, 787, 796

(56) References Cited

U.S. PATENT DOCUMENTS

| | | | |
|---|---|---|---|
| 6,429,508 B1 * | 8/2002 | Gang ................ | 257/678 |
| 6,498,392 B2 * | 12/2002 | Azuma .............. | 257/676 |
| 6,777,788 B1 * | 8/2004 | Wan et al. ......... | 257/670 |
| 6,794,738 B2 * | 9/2004 | Mahle ............... | 257/673 |
| 6,818,973 B1 * | 11/2004 | Foster .............. | 257/676 |
| 2002/0117740 A1 * | 8/2002 | Jang et al. ........ | 257/677 |

(Continued)

FOREIGN PATENT DOCUMENTS

JP          5-129473      *  5/1993

(Continued)

Primary Examiner—Alexander Oscar Williams
(74) Attorney, Agent, or Firm—Beyer Weaver & Thomas LLP (57) ABSTRACT

A number of apparatus for packaging semiconductor devices using an epoxy ink or adhesive. In one embodiment, a pattern of epoxy is formed on the bottom surface of die attach pad of a leadless semiconductor package. The pattern of epoxy divides the undersurface of the die attach pad into a grid of small squares. A small amount of solder paste is then applied within each square of the grid. When the leadless package is attached to a substrate, each of the solder balls evenly reflows to the same approximate height. This enhances the attachment of the package to the substrate and reduces the need for rework. In another embodiment, a protective layer of epoxy or ink is provided around the periphery of the die after it has been attached to the die attach pad. The protective layer covers any solder material that may leach out from between the die and the die attach pad. In another embodiment, a protective layer of epoxy or ink is provided on the exposed tie bars of the lead frame after encapsulation. The protective layer of ink helps reduce burring and the formation of slivers at the cutting surface when the tie bars are cut during singulation. In another embodiment, an isolation layer of epoxy or ink may be used to cover and electrically isolate the leads of a lead frame. Finally, in yet another embodiment, a patterned layer of epoxy or ink may be used on the bottom surface of a semiconductor package. The layer of ink is patterned to include a plurality of recess regions that form a physical barrier surrounding where solder contact balls are to be formed on the package surface. The patterned layer of ink thus prevents solder ball "swimming" by confining the solder balls to within the physical barriers created by the recess regions.

8 Claims, 6 Drawing Sheets

U.S. PATENT DOCUMENTS

| | | | |
|---|---|---|---|
| 2002/0135065 A1 * | 9/2002 | Zhao et al. | 257/738 |
| 2002/0140064 A1 * | 10/2002 | Wu et al. | 257/670 |
| 2002/0149092 A1 * | 10/2002 | Lee | 257/668 |
| 2003/0057534 A1 * | 3/2003 | Ho et al. | 257/678 |
| 2004/0038442 A1 * | 2/2004 | Kinsman | 438/64 |
| 2004/0041282 A1 * | 3/2004 | Kinsman | 257/796 |
| 2004/0043537 A1 * | 3/2004 | Tomihara | 438/113 |
| 2004/0084757 A1 * | 5/2004 | Seo | 257/672 |
| 2004/0089464 A1 * | 5/2004 | Yamada | 174/52.3 |
| 2004/0113251 A1 * | 6/2004 | Tan | 257/684 |
| 2004/0114426 A1 * | 6/2004 | Fee et al. | 365/158 |
| 2004/0124516 A1 * | 7/2004 | Nakamura et al. | 257/685 |
| 2004/0124545 A1 * | 7/2004 | Wang | 257/784 |
| 2004/0136123 A1 * | 7/2004 | Nakamura et al. | 361/35 |
| 2004/0159913 A1 * | 8/2004 | Igarashi et al. | 257/622 |

FOREIGN PATENT DOCUMENTS

| | | | |
|---|---|---|---|
| JP | 7-86484 | * | 3/1995 |
| KR | 2002088270 A | * | 11/2002 |

* cited by examiner

USING ADHESIVE MATERIALS AS INSULATION COATINGS FOR LEADLESS LEAD FRAME SEMICONDUCTOR PACKAGES

FIELD OF THE INVENTION

The present invention relates generally to the packaging of semiconductor devices, and more particularly, to an apparatus and methods for using adhesive materials as insulating coatings for leadless lead frame semiconductor packages.

BACKGROUND OF THE INVENTION

Leadless lead frames are commonly used to package semiconductor devices. A leadless lead frame includes a plurality of die attach pads arranged in an array. Leads are provided around each of the die attach pads. Tie bars are used to hold the die attach pads and the contacts together. During the packaging process, a die is attached to each die attach pad using an epoxy or other adhesive. Wire bonds are then formed between the dice and the adjacent leads respectively. The surface of the lead frame with the dice attached thereon is then encapsulated, typically with an epoxy, using a transfer mold. Once the epoxy cures, the leaded frame is mechanically buffed to remove any mold compound flash or bleed. A mask printing is then performed to isolate the traces on the backside of the package that could potentially cause an electrical short on the PCB or to isolate areas on the exposed DAP to improve solder the uniformity of solder deposition and subsequent solder reflow. A solder plate is then applied to the undersurface of the die attach pad. The solder paste is used to later attach the package to a substrate such as a printed circuit board after it has been signulated from the lead frame. The individual packages are singulated by cutting the lead frame along the tie bars.

A number of problems are associated with the process of attaching the singulated packaged devices to a substrate. When the solder paste is applied to the undersurface of the die attach pads, it is usually dispensed as a ball at the center of the pad. During the attachment process when the solder is reflowed, the material tends to flow toward the periphery of the pad. As a consequence, the solder paste tends assume an "dome" shape. The height of the dome formed on the exposed DAP is problematic because it is typically higher than the "dome" formed on the input/output pads of the chip. As a consequence, board mounting can be very difficult. This uneven heights of the two domes tends to complicate the process of attaching the package to the substrate. To alleviate this problem, a solder paste stencil design for each and every type of package size and configuration is required will have to ensure the uniform height of solder bumps on the package. This process is not only tedious, it is difficult to optimize. Each package type will require different amounts of solder paste, depending on the size of the die attach surface and other factors.

In other applications, adhesive materials have been used to isolate exposed parts of the lead frame. Ideally only the input/output solder pads should be exposed on the backside of the package. All other features should be insulated to minimize the possibility of electrical shorting.

An apparatus and methods for using adhesive materials as insulating coatings for leadless lead frame semiconductor packages is therefore needed.

SUMMARY OF THE INVENTION

To achieve the foregoing, and in accordance with the purpose of the present invention, a number of apparatus for packaging semiconductor devices using an epoxy ink or adhesive is disclosed. In one embodiment, a pattern of epoxy is formed on the bottom surface of die attach pad of a leadless semiconductor package. The pattern of epoxy divides the undersurface of the die attach pad into a grid of small squares. A small amount of solder paste is then applied within each square of the grid. When the leadless package is attached to a substrate, each of the solder balls evenly reflows to the same approximate height. This enhances the attachment of the package to the substrate and reduces the need for rework In another embodiment, a protective layer of epoxy or ink is provided around the periphery of the die after it has been attached to the die attach pad. The protective layer covers any solder material that may leach out from between the die and the die attach pad. In another embodiment, a protective layer of epoxy or ink is provided on the exposed tie bars of the lead frame after encapsulation. The protective layer of ink helps reduce burring and the formation of slivers at the cutting surface when the tie bars are cut during singulation. In another embodiment, an isolation layer of epoxy or ink may be used to cover and electrically isolate the leads of a lead frame. Finally, in yet another embodiment, a patterned layer of epoxy or ink may be used on the bottom surface of a semiconductor package. The layer of ink is patterned to include a plurality of recess regions that form a physical barrier surrounding where solder contact balls are to be formed on the package surface. The patterned layer of ink thus prevents solder ball "swimming" by confining the solder balls to within the physical barriers created by the recess regions.

BRIEF DESCRIPTION OF THE DRAWINGS

The invention, together with further advantages thereof, may best be understood by reference to the following description taken in conjunction with the accompanying drawings in which.

In the Figures, like reference numbers refer to like components and elements.

DETAILED DESCRIPTION OF THE INVENTION

Although the foregoing invention has been described in some detail for purposes of clarity of understanding, it will be apparent that certain changes and modifications may be practiced within the scope of the appended claims. Therefore, the described embodiments should be taken as illustrative and not restrictive, and the invention should not be limited to the details given herein but should be defined by the following claims and their full scope of equivalents.

Figure 1:
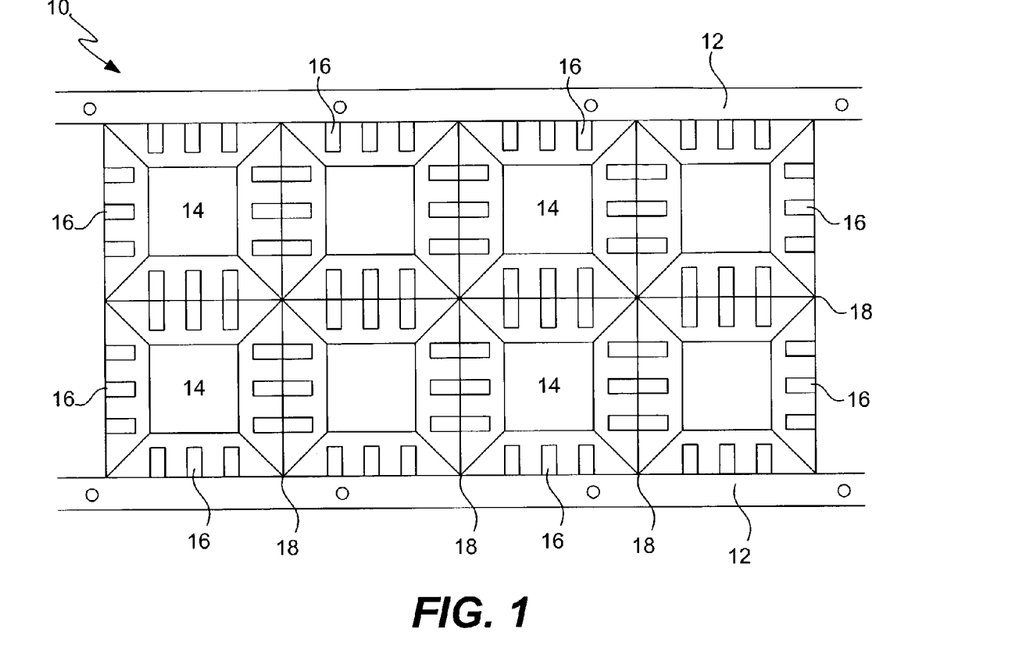
FIG. 1 is diagram of a lead frame for packaging semiconductor devices.

Referring to FIG. 1, a diagram of a lead frame for packaging semiconductor devices is shown. The lead frame 10 includes a frame 12, a plurality of die attach pads 14, a plurality of leads 16 surrounding each of the die attach pads 14, and horizontal and vertical tie bars 18 for holding the die attach pads 14 and the leads 16 in place. The lead frame 10 is generally made of a conductive metal, such as copper.

Figure 2:
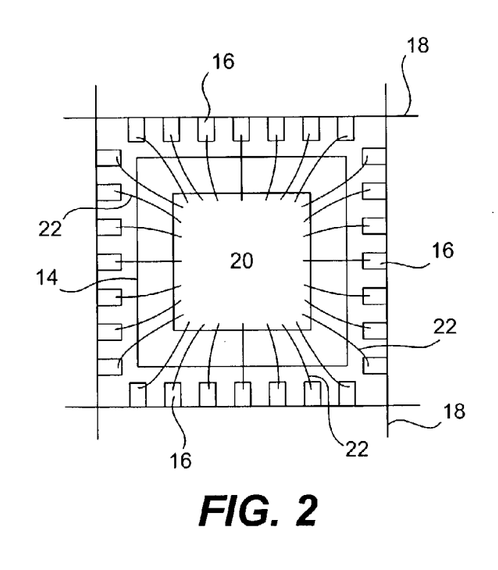
FIG. 2 is a diagram of a die attached to a die attach pad of a lead frame used for packaging semiconductor devices.

Referring to FIG. 2, a diagram of a die 20 attached to a die attach pad 14 of the lead frame 10 is shown. Prior to attaching the die 20, an epoxy or adhesive (not shown) is applied to the die attach pad 14. Once the die is attached, wire bonds 22 are formed between pads (not shown) on the die 20 and the leads 16 associated with the pad 14. The die attach and wire bonding process is repeated for all of the die attach pads 14 of the lead frame 10. An encapsulant material (not shown), such as epoxy, is then used to encapsulate the all of the dice 20 on the lead frame 10. Typically the lead frame 10 is placed in a mold and the encapsulant material is extruded into the mold. Once the material cures, the lead frame is buffed, marked, and then singulated by sawing or cutting the lead frame along the vertical and horizontal tie bars 18.

Figure 3:
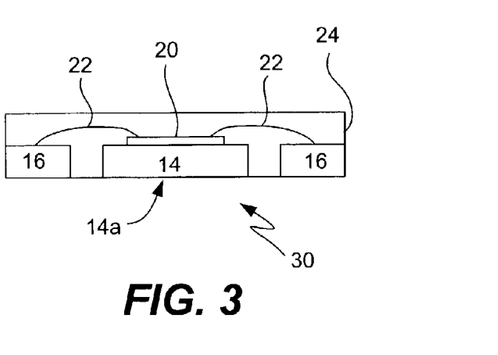
FIG. 3 is a cross section of a packaged semiconductor device.

Referring to FIG. 3, a cross section of a packaged semiconductor device 30 singulated from the lead frame 10 is shown. As is illustrated in the figure, the die 20 is shown attached to the die attach surface of the pad 14. Wire bonds 22 are provided to electrically couple the die 20 and the leads 16. The device 30 is encapsulated within the encapsulant material 24. Note the bottom surface of the leads 16 and the die attach pad 14 are typically exposed and are not encapsulated. The bottom surface of the die attach pad 14a, as described below, is used to mount the device 30 onto a substrate such as a printed circuit board. The contacts 16 are used to provide electrical connections between contact pads on the substrate and the device 30.

Figure 4A:
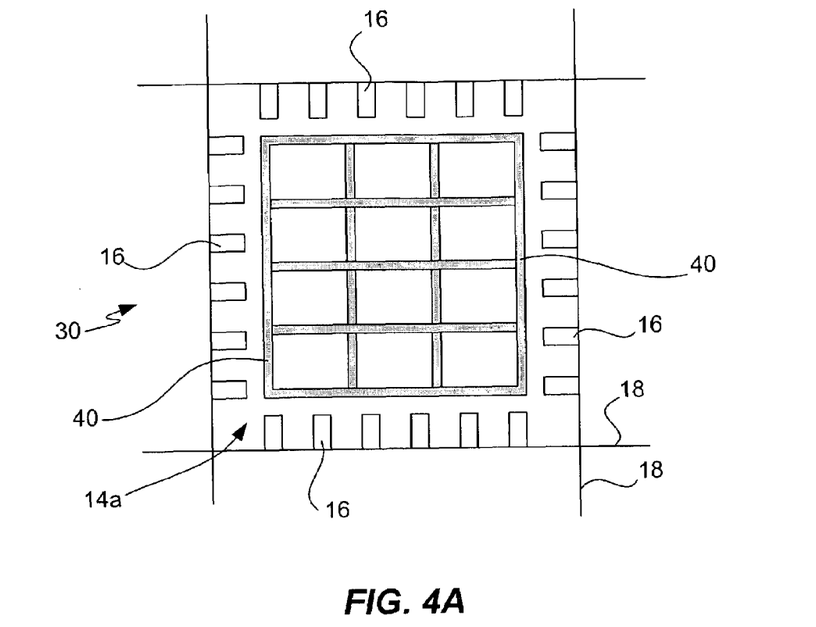
FIG. 4A is a diagram of a grid of ink formed on the die attach area of a lead frame according to the present invention.

Referring to FIG. 4A, a bottom view of device 30 showing a printed matrix or grid 40 formed on the undersurface 14a of die attach pad 14 according to the present invention is shown. According to one embodiment, the grid 40 is formed by a photolithographic process of patterning horizontal and vertical lines of an adhesive onto the die attach pad 14 to form the matrix pattern. The height or thickness of the adhesive, according to various embodiments of the invention may range from 2/1000 of an inch to 1/10000 of an inch. In one specific embodiment, the applicants have used a thickness of 1/1000 of an inch. According to other embodiments, the adhesive has the properties of being electrically non-conductive, can withstand the temperatures of solder reflow and plating (typically 240–260 degrees C.), adheres to copper and molding compounds, and can withstand the chemical cleaning process typically used to remove excess solder plate material during standard packaging operations. In an alternative embodiment, the grid 40 is formed by printing an ink onto the surface of the of the die attach pad 14. With this embodiment, an ink 4488 HC Black ink from Markem Corporation of Keene, N.H. is used. It should be noted that for the sake of simplicity, only one device 30 is shown in the figure. In various embodiments of the invention, the grid 40 is provided on each of the devices 30 on a lead frame 10. The grid can also be formed via screening or by stencil printing.

Figure 4B:
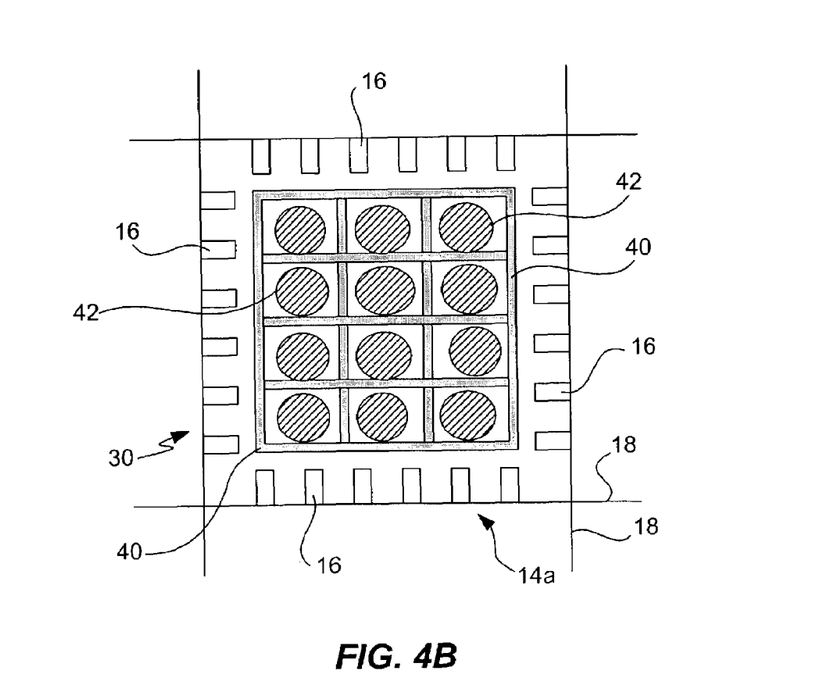
FIG. 4B is a diagram of the die attach area of FIG. 4A with a die attached thereon.

As illustrated in FIG. 4B, the grid 40 enables relatively small amounts of a known quantity of solder paste or balls 42 to be dispensed into each of the individual squares of the grid 40. In one embodiment, the size of the individual squares of the grid 40 are the same size and the amount of solder to dispense within each square is the same. As a result, the height of the solder bumps within each square of the grid 40 is of the approximate same height after reflow. This provides a number of advantages. It eliminates the problems associated with the dome shaped solder during reflow. It makes the process of mounting the device 30 onto a substrate easier and more robust, reducing the need for rework and optimizing processing yield. It also provides the advantage of defining a standard size of the individual squares of the matrix 40. This allows the standardization of solder bump formation, regardless of the type or size of the die attach pad 14. Again, this reduces the amount of experimentation that is often required for the mounting of different types of devices onto printed circuit boards.

Figure 5A:
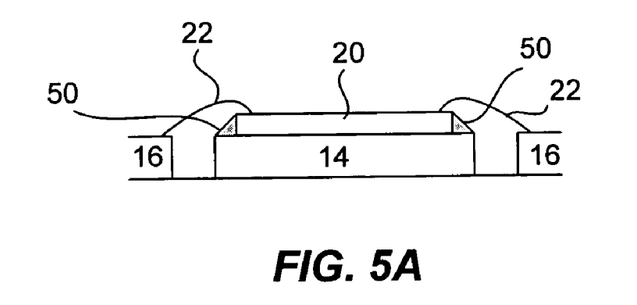
FIGS. 5A and 5B are diagrams of a die attached to a die attach pad of a lead frame with epoxy around the periphery of the die according to the present invention.
Figure 5B:
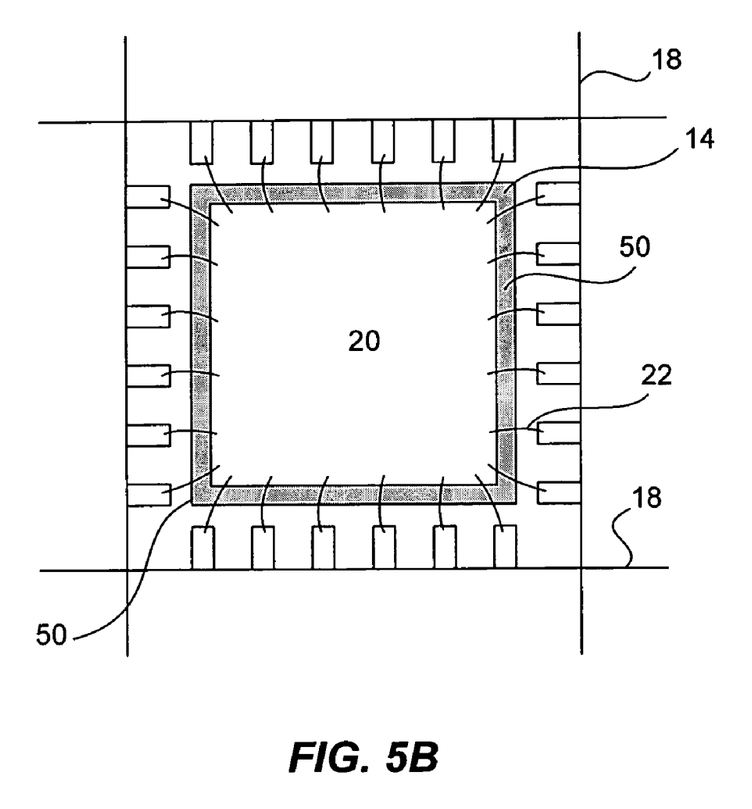

Referring to FIGS. 5A and 5B a cross-section and a top-down view of a chip package using another embodiment of the present invention is shown. With this embodiment, a protective coating of ink or epoxy 50 is provided on the die attach pad 14 around the periphery of the die 20. The purpose of the coating 50 is to cover any solder material that may leach out from between the die attach pad 14 and the die 20. According to various embodiments of the invention, the coating 50 has a thickness ranging from 0.0005 inch to 0.002 inch. The same type of ink or epoxy described above can be used for the coating 50.

Figure 6:
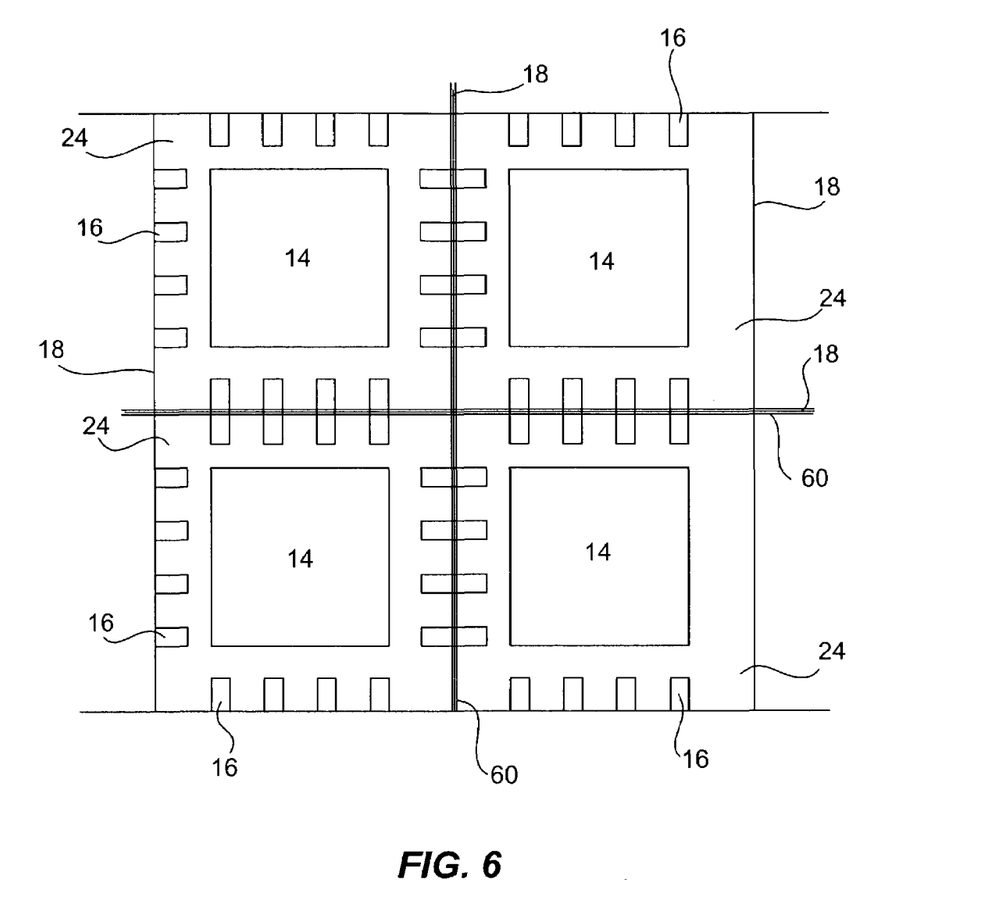
FIG. 6 is a diagram of lead frame with epoxy provided on the tie bars according to the present invention.

Referring to FIG. 6, a partial diagram of the lead frame 10 is shown for the purpose of illustrating another embodiment of the present invention. In this figure, a bottom view of the lead frame 10 after die attach, wire bonding, and encapsulation, is shown. As such, only the underside of the die attach pads 14, leads 16, and the tie bars 18 of the lead frame 10 are exposed. The encapsulant material 24 covers the top surface of the lead frame 10 including the dice 20 and wire bonds 22. With this embodiment, a protective layer 60 of ink or adhesive is provided over the tie bars 18. The purpose of the protective layer 60 is to prevent burring when the lead frame 10 is cut during singulation of the dice. Burring often occurs when spurs or slivers of metal are formed when the cutting blade cuts through the copper metal of the tie bars 18. The metal particles resulting from cutting may fuse and form slivers and burrs. The protective layer 60 provides a barrier that tends to prevent the formation of burrs and slivers during the cutting process. In various embodiments of the invention, the protective layer 60 can be applied manually, screening, stencil printing, or by any other suitable process.

Figure 7A:
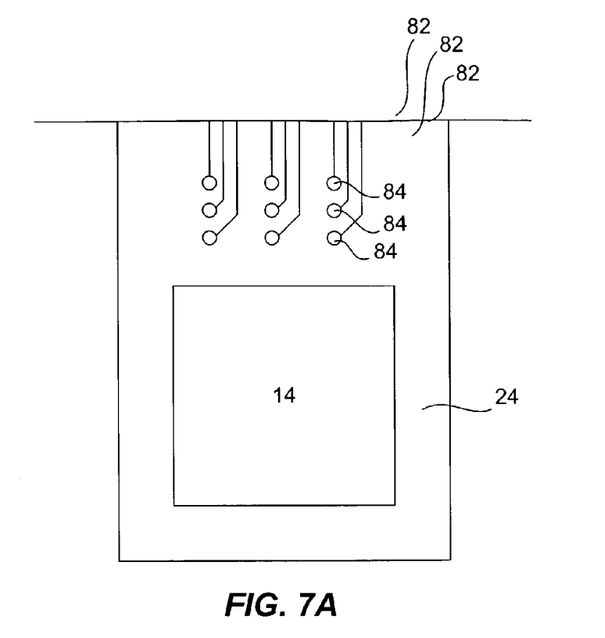
FIGS. 7A–7C are diagrams of the leads of a lead frame that are covered with mask according to one embodiment of the present invention.
Figure 7B:
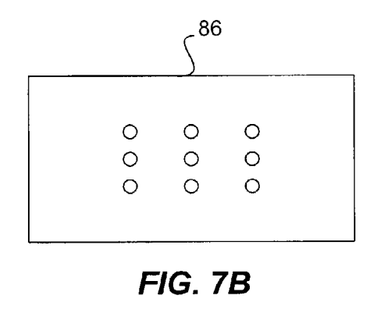
Figure 7C:
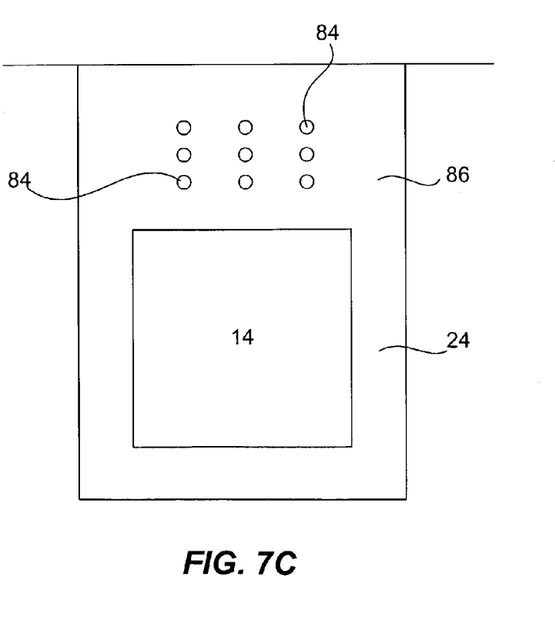

Referring to FIGS. 7A and 7B, another embodiment for using ink in packaging semiconductor devices is shown. As best illustrated in FIG. 7A, a bottom view of a package 80 is shown. The package 80 includes a die attach pad 14 and lead 82. Each lead 82 includes a contact surface 84. The top surface of both the die attach pad 14, leads 82 and contact surfaces 84 are encapsulated in a material 24 and are therefore not exposed. The bottom surface of the die attach pad 14, leads 82 and contacts 84 are not encapsulated and therefore are exposed and are visible in FIG. 7A. For the sake of simplicity, leads 82 and contacts 84 are illustrated only on one side of the die attach pad. In actual embodiments, the leads 82 and contacts 84 would typically be provided on all four sides of the die attach pad 14. With this embodiment, an isolation layer 86 as illustrated in FIG. 7B of either epoxy ink or an adhesive epoxy is used to cover the leads 82 of the package. As illustrated in FIG. 7C, the isolation layer 86 is mask patterned to cover the leads 82 but not the contact regions 84. The isolation layer 86 provides a number of advantages. It allows the use of thinner lead frame materials. It electrically isolates the leads 82 from one another. It also enables the location of the contacts 84 to be closer to the die and in a straight line, making wire bonding and inspection easier. In alternative embodiments, the isolation layer 86 may be formed using screening or stencil printing.

Figure 8A:
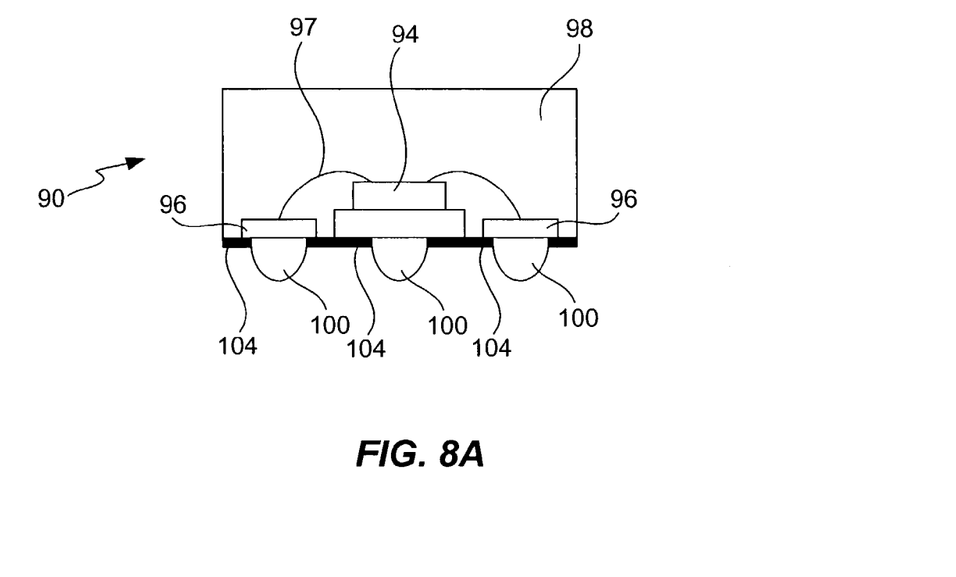
FIGS. 8A and 8B are diagrams of a patterned layer of epoxy formed on the bottom of a semiconductor package for defining a physical barrier for where solder balls are to be formed on the bottom of the semiconductor package according to another embodiment of the present invention.
Figure 8B:
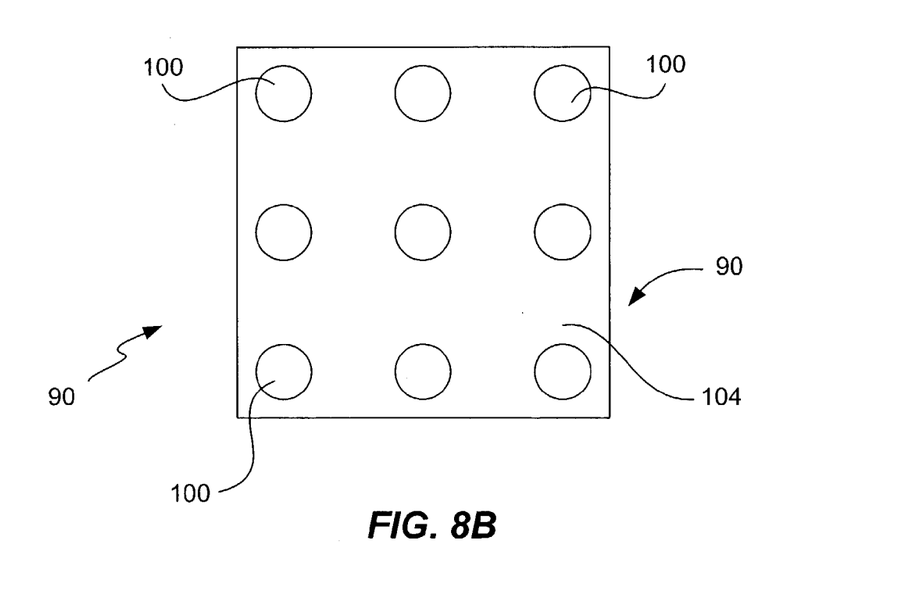

Referring to FIGS. 8A and 8B, yet another embodiment of the present invention directed to a mask that is used for ball attach to a semiconductor package is shown. As is illustrated in FIG. 8A, a cross section of a semiconductor package 90 is provided. The package 90 includes a die attach pad 92, a die 94, contact pads 96, wire bonds 97 coupling the die 94 and the contact pads 96, an encapsulant material 98, and solder ball contacts 102 formed on the contact pads 96. A patterned layer of material 104 is provided on the underside of the package 90 between the solder balls 102. Referring to FIG. 8B, a bottom view of the package 90 is shown. As is evident in the this figure, the layer of material 104 is formed on the entire bottom surface of package except for the recess regions where the solder balls 100 are to be formed. The recess regions thus provide a physical barrier in which the solder balls 100 are later formed. The patterned layer 104 provides a number of advantages. It allows the use of a die larger than the Die Attach Paddle (DAP) using a standard non-conductive epoxy die attach process. The patterned layer 104 provides a physical barrier for the solder balls 102 that confines the ball to the designated location and prevents solder ball "swimming". Finally, the patterned layer 104 enables a smaller package design than using current production design rules because it allows the use of a die larger than the die attach paddle. In various embodiments of the invention, the pattern layer is made of an epoxy ink or adhesive. It may be formed on the surface of the package 90 in a variety of ways, including screening, stencil printing, or photolithography for example.

The embodiments of the present invention described above are to be considered as illustrative and not restrictive. The invention is not to be limited to the details given herein, but may be modified within the scope and equivalents of the appended claims.

What is claimed is:

1. An apparatus comprising:
a semiconductor package including:
a die attach pad having a first surface for attaching a die within the semiconductor package and second surface for attaching the package to a substrate;
a grid pattern formed on the second surface of the die attach pad, the grid pattern defining a plurality of square regions created by one or more horizontal and vertical lines formed on the second surface, wherein the grid pattern grid formed on the second surface of the die attach pad is formed by one of the following materials: epoxy or ink.

2. The apparatus of claim 1, further comprising a plurality of solder balls formed between the one or more horizontal and vertical lines of the matrix.

3. The apparatus of claim 1, wherein the grid pattern has a thickness ranging from 2/1000 to 1/10000 of an inch.

4. The apparatus of claim 1, wherein the square regions of the grid are all substantially the same size.

5. The apparatus of claim 1, wherein the grid is substantially electrically non-conductive.

6. The apparatus of claim 1, wherein the grid is a material that has one of more of the following properties: can withstand temperatures of solder reflow; adheres to molding compound and can withstand the chemical cleaning process used for cleaning solder.

7. The apparatus of claim 1, wherein the grid is formed using one of the following: photolithograph; screening, or stencil printing.

8. An apparatus, comprising:
a die attach pad having a die attach surface;
a die;
a die attach material configured to attach the die to the die attach surface of the die attach pad; and
a coating covering the die attach material that may leach out from between the die attach surface and the periphery of the die.

* * * * *

UNITED STATES PATENT AND TRADEMARK OFFICE
CERTIFICATE OF CORRECTION

PATENT NO. : 6,930,377 B1
DATED : August 16, 2005
INVENTOR(S) : Jaime A. Bayan

It is certified that error appears in the above-identified patent and that said Letters Patent is hereby corrected as shown below:

Column 6,
Line 15, change "grid pattern grid" to -- pattern grid --.
Line 28, change "one of more" to -- one or more --.
Line 33, change "photolithograph" to -- photolithography --.

Signed and Sealed this

Twenty-seventh Day of December, 2005

JON W. DUDAS
*Director of the United States Patent and Trademark Office*